(12) United States Patent
Ramalho et al.

(10) Patent No.: US 6,304,396 B1
(45) Date of Patent: Oct. 16, 2001

(54) ARRANGEMENT FOR READING INFORMATION FROM A MAGNETIC RECORD CARRIER

(75) Inventors: Joao N. V. L. Ramalho, Bieville-Beuville (FR); Johannes O. Voorman, Eindhoven (NL); Patrick Leclerc, Caen (FR); Jozef A. M. Ramaekers, Eindhoven (NL); Marcel L Lugthart, Eindhoven (NL); Johannes W.M. Bergmans, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/241,013

(22) Filed: Feb. 1, 1999

(30) Foreign Application Priority Data

Feb. 5, 1998 (EP) .................................................. 98400243
Nov. 12, 1998 (EP) .................................................. 98402802

(51) Int. Cl.$^7$ ...................................................... G11B 5/02
(52) U.S. Cl. ............................... 360/25; 360/46; 360/67; 360/53
(58) Field of Search ............................. 360/46, 67, 66, 360/25, 53, 65, 315

(56) References Cited

U.S. PATENT DOCUMENTS 5,331,478 * 7/1994 Aranovsky .......................... 360/67
5,559,646   9/1996 Voorman et al. .................... 360/67

\* cited by examiner

*Primary Examiner*—Alan T. Faber
(74) *Attorney, Agent, or Firm*—Edward W. Goodman

(57) ABSTRACT

An arrangement is disclosed for reading information from a record carrier. The arrangement comprises a read head having at least one magneto-resistive element ($R_{mr}$), a first transistor ($Tr_1$) and a second transistor ($Tr_2$). The base of the first transistor ($Tr_1$) is coupled to the emitter of the second transistor ($Tr_2$) via a first capacitor (6). The base of the second transistor ($Tr_2$) is coupled to the emitter of the first transistor ($Tr_1$) via a second capacitor (8). The arrangement further comprises a non-linear transconductance amplifier (14) having first and second inputs coupled to the output terminals (10,12) of the arrangement, and having and inverting and non-inverting outputs coupled to the bases of the first and second transistor. The non-linear transconductance amplifier (14) is adapted to supply a control current at its inverting and non-inverting outputs in response to a voltage present across its inputs, such that for first and second input voltages resulting in first and second output currents, respectively, the first input voltage being larger than the second input voltage, the amplification factor of the transconductance means being larger for generating the first output current than for generating the second output current.

12 Claims, 5 Drawing Sheets

ARRANGEMENT FOR READING INFORMATION FROM A MAGNETIC RECORD CARRIER

Figure 1:
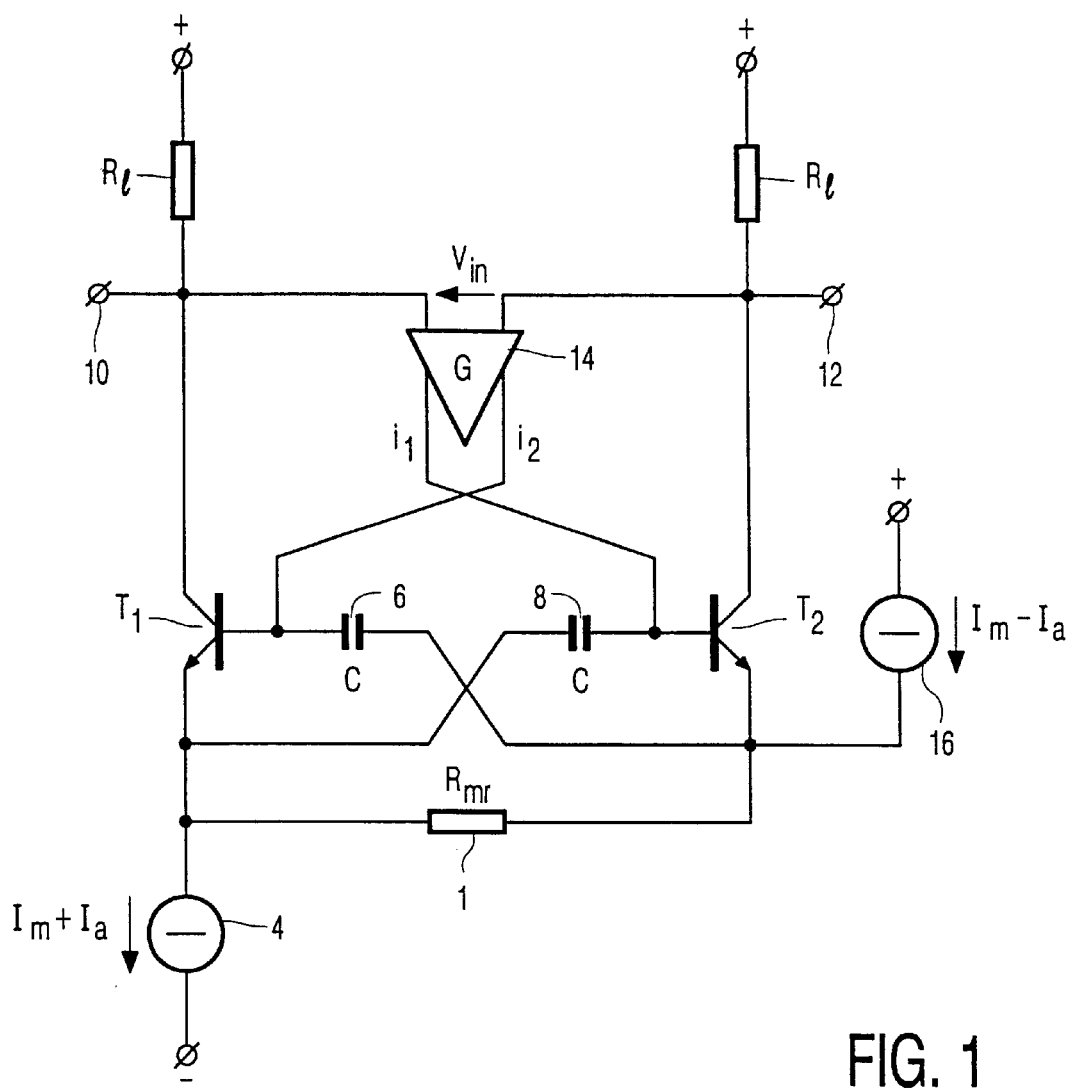

The invention relates to an arrangement for reading information from a record carrier, the arrangement comprising:

a read head having at least one magneto-resistive element ($R_{mr1}$), a first transistor ($Tr_1$) having a control terminal and first and second main terminals, a second transistor ($Tr_2$) having a control terminal and first and second main terminals, the control terminal of the first transistor being coupled to the first main electrode of the second transistor via a first capacitive element (8), the control terminal of the second transistor being coupled to the first main electrode of the first transistor via a second capacitive element (6), the first main electrode of the first transistor being coupled to a terminal of the said magneto-resistive element ($R_{mr1}$), the first main electrode of the second transistor being coupled to a terminal of a second magneto-resistive element ($R_{mr2}$), the second main electrodes of the first and the second transistor being coupled to a first point of constant potential (+) via first and second impedance means ($R_1$), respectively and to a hard disk drive provided with the arrangement. Such arrangement is known from U.S. Pat. No. 5,559,646 and is used for reading information from eg. a hard disk.

Amplifiers for magneto-resistive (MR) heads sense very small variations in the MR resistance (typically 1%) and amplify these signals. MR elements are biased by either a voltage or a current. Variations in the resistance of the MR heads, due to a magnetic field, result in small signal voltages and/or currents which can be detected by the sense amplifiers. The biasing of the MR heads causes a DC voltage across the head. MR sense amplifiers must be AC coupled to the heads. To avoid filtering at the low end of the data frequency spectrum, which results in data distortion, the AC coupling has a long time constant, typically at 1 μs. Large transients, such as those caused during thermal asperities, pass the AC coupling and cause the amplifier to overload, resulting in loss of data during long periods.

The invention aims at providing an improved arrangement for reading information from the record carrier. In accordance with the invention, the arrangement is characterized in that non-linear transconductance means (14) are provided having first and second inputs coupled to the second main electrodes of the first and second transistor, respectively, and first and second outputs coupled to the control terminal of the first and second transistor, respectively, the non-linear transconductance means being adapted to supply a control current at the first output in response to a voltage present across its inputs, such that for first and second input voltages across said inputs, resulting in first and second control currents, respectively, at said first output, the first input voltage being larger than the second input voltage, the amplification factor of the transconductance means being larger for generating the first control current than for generating the second control current.

The invention is based on the following recognition.

The MR heads fly above the disk at very low heights (typically 10 nm). When a collision with a particle on the disk takes place, kinetic energy is transferred to heat. The resistance of the MR elements increases (maximally some 10–20%). As the bias current remains constant, the baseline voltage (that is: the low frequency component of the output signal) increases rapidly. Further, the signal amplitude of the wanted signal changes by not more than the same 10–20%. After the thermal asperity, the MR element cools down slowly. These large unwanted baseline shifts saturate the read amplifier during long periods.

In accordance with the invention, the non-linear transconductance means result in a non-linear operation of the bias control loop of the amplifier (which determine the time constant of the AC coupling). This leads to a shift of the lower bandwidth of the read amplifier towards higher frequencies, in dependence of the amplitude of the thermal asperity (or any other transient). In this way, thermal asperities are compressed. This prevents overflow in the read amplifier and allows the channel IC to recover the data without making incorrectably many bit errors.

Further, in accordance with the invention, an additional DC correction can be carried out in order to further suppress the thermal asperities. This is the subject of the claims 8, 9 and 10. In addition, it may be required to add a detection circuit to detect thermal asperities, e.g. so as to freeze the circuits in the read out circuit, in the event that the thermal asperities would otherwise severely distort the read out circuit. This thermal asperity detection is the subject of claim 11.

Figure 2:
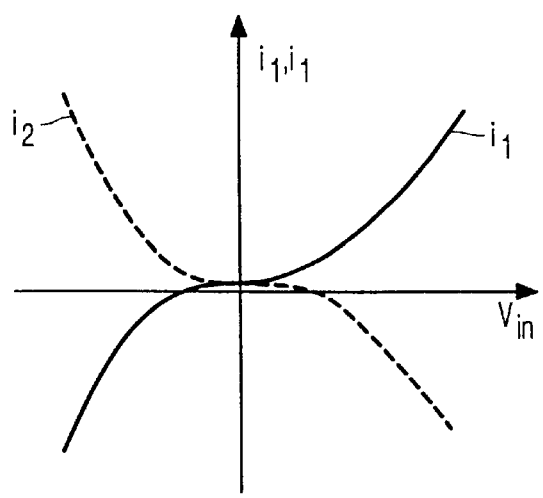
Figure 3:
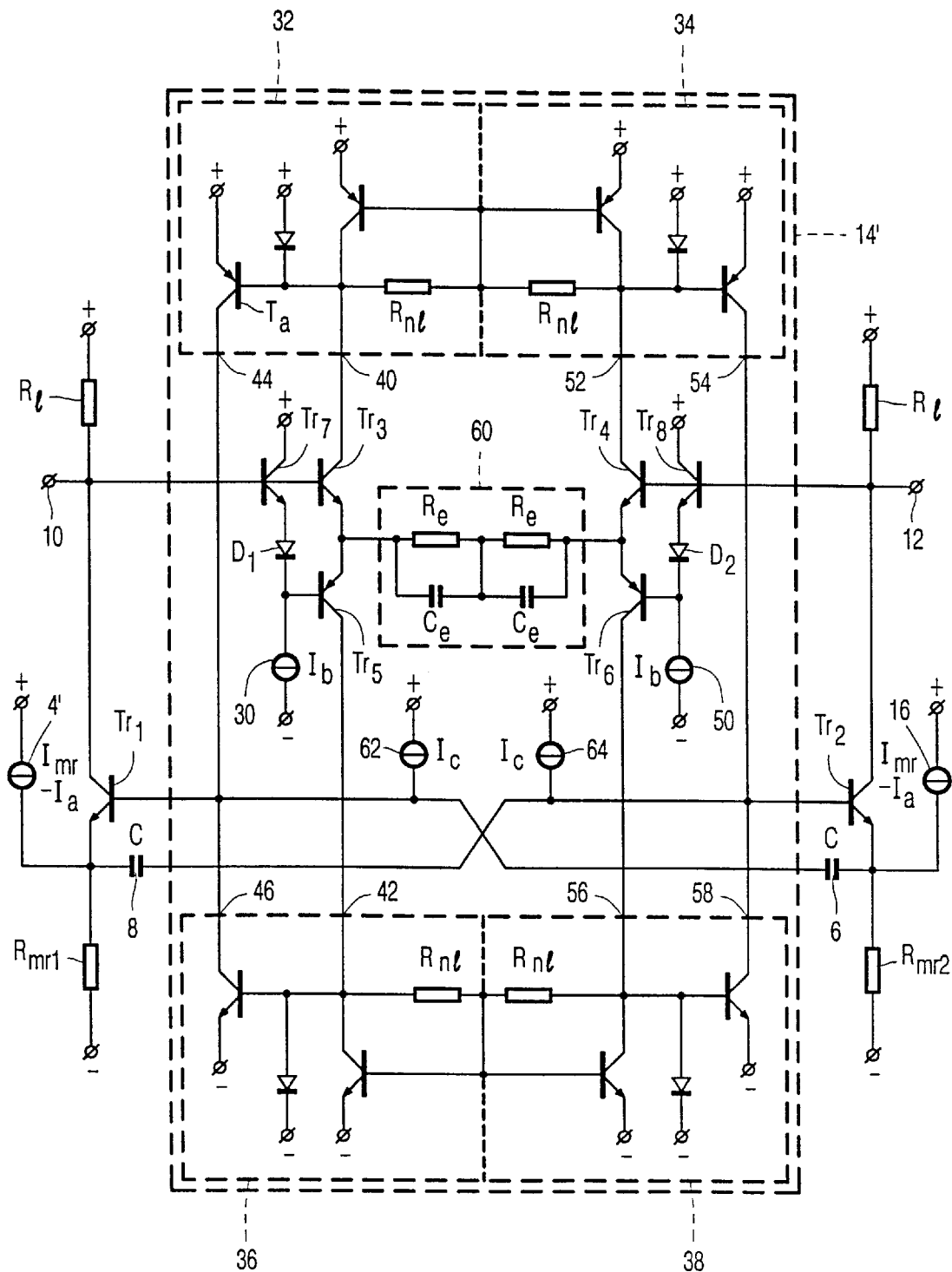
Figure 4:
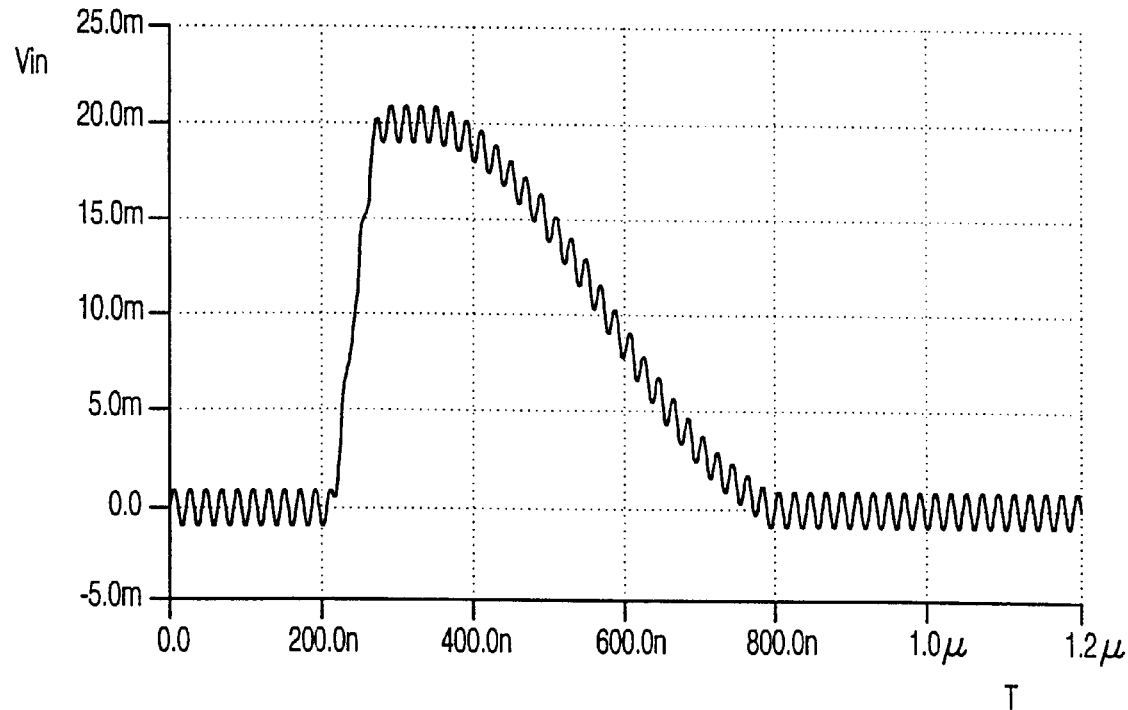
Figure 5:
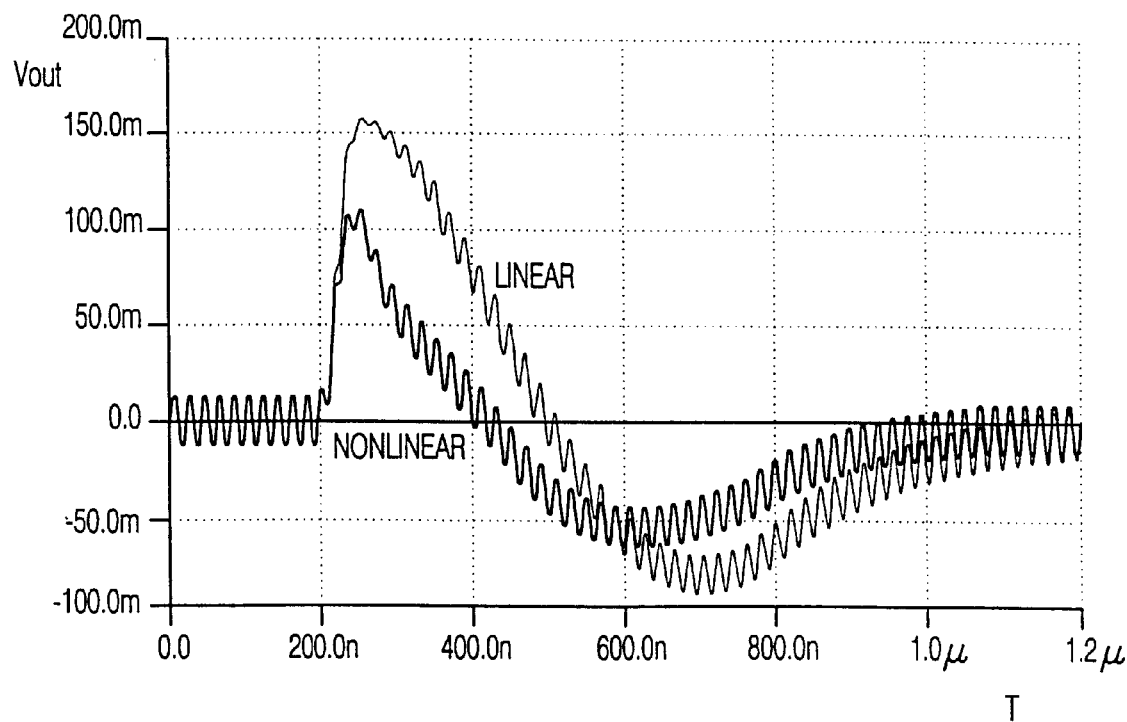
Figure 6:
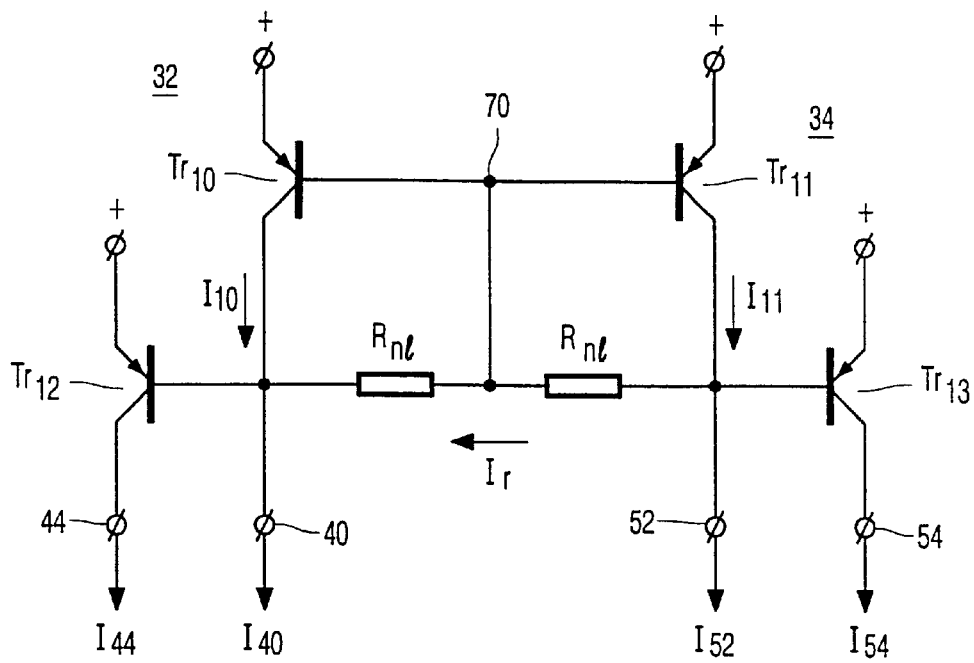
Figure 7:
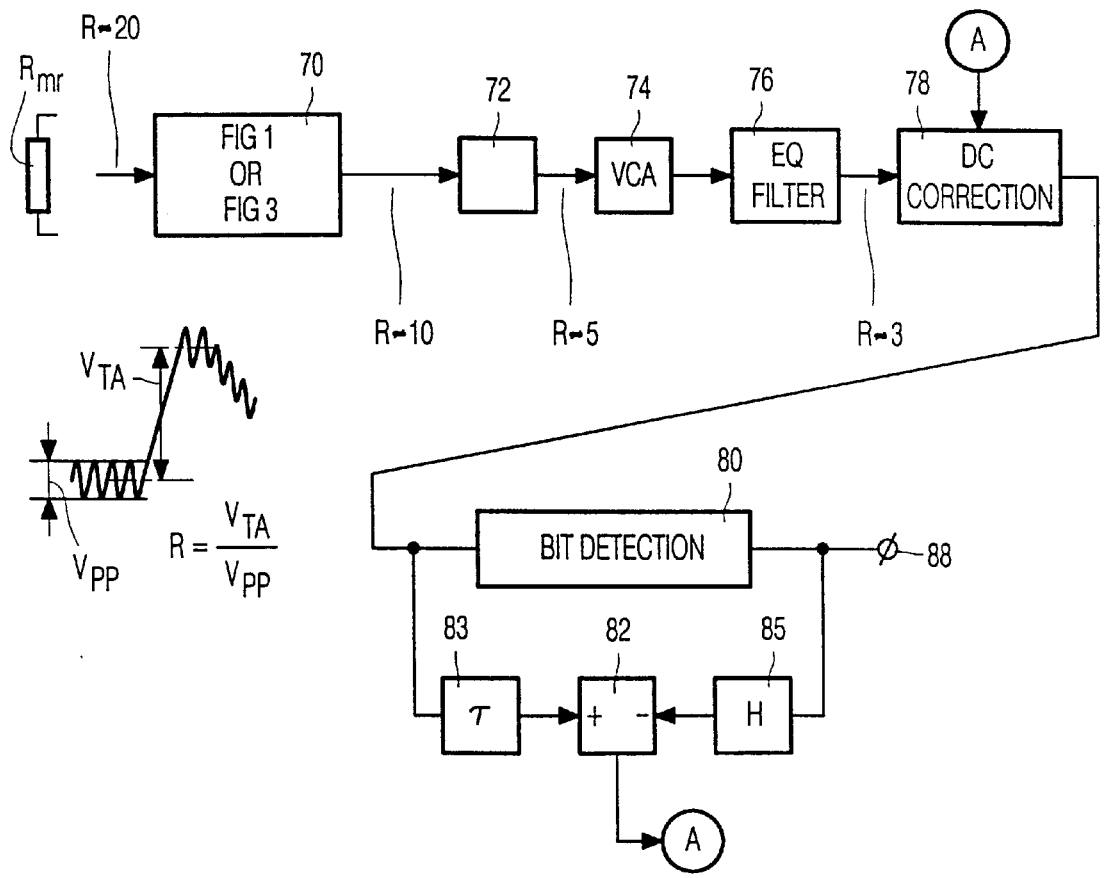
Figure 8:
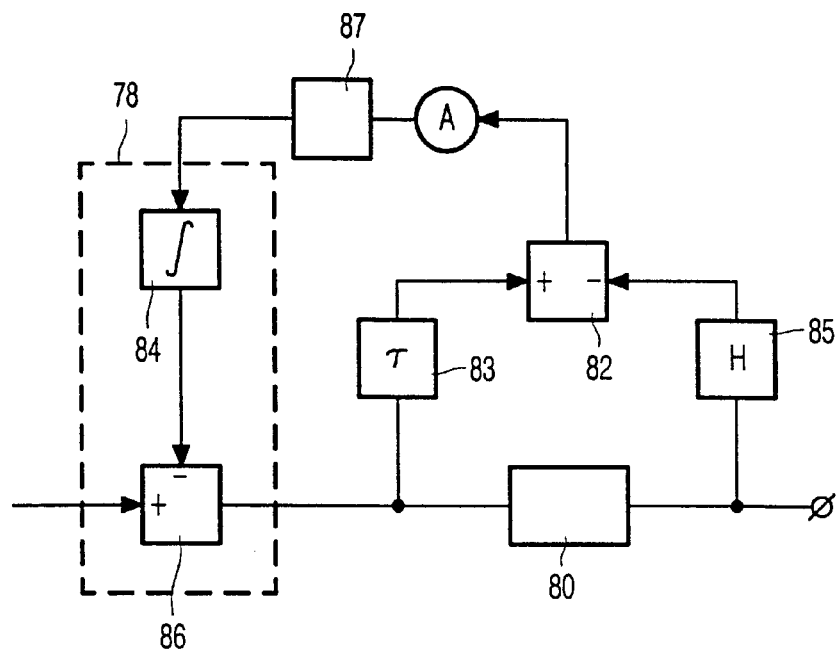
Figure 9:
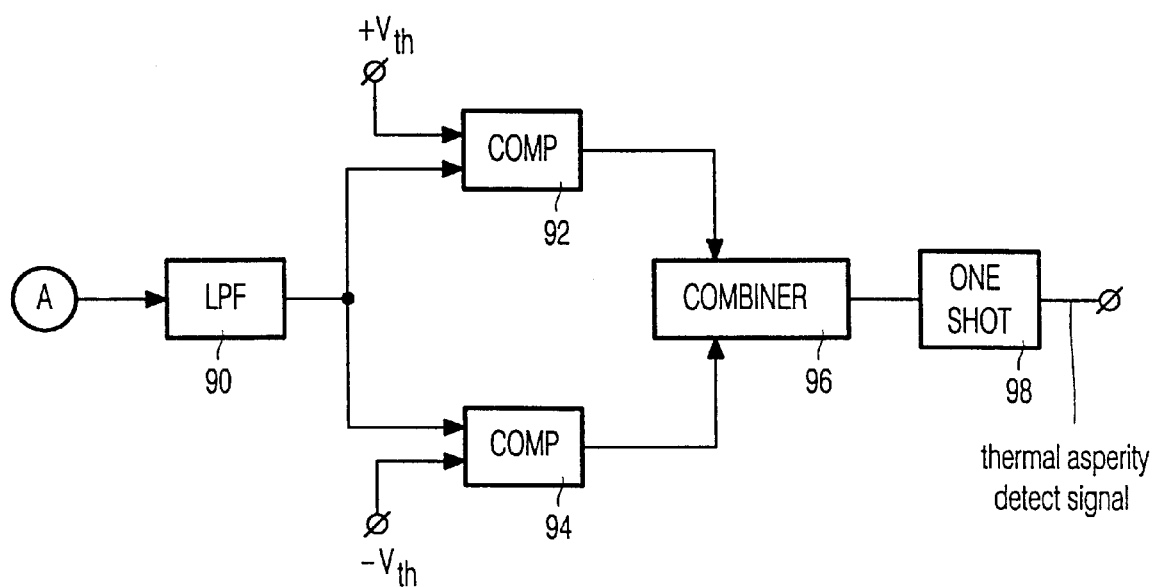

These and other aspects of the invention will be discussed in more detail hereinafter with reference to the disclosure of preferred embodiments in the figure description, in which FIG. 1 shows a first embodiment of the arrangement, FIG. 2 shows amplifier characteristics of the non-linear transconductance amplifier of the arrangement for generating the control currents, FIG. 3 shows a second embodiment of the arrangement, and FIG. 4 shows an input signal for the read amplifier as a function of time, distorted by an asperity, FIG. 5 shows two output signals as a function of time, one for an apparatus provided with a linear transconductance and one for the apparatus in accordance with the invention and provided with a non-linear transconductance, FIG. 6 shows an explanation of the non-linear behaviour of the current mirror circuit in the transconductance amplifier of FIG. 3, FIG. 7 shows a further embodiment of the arrangement, provided with a DC correction circuit for further correcting the thermal asperity, FIG. 8 shows an elaborated version of the DC correction circuit of FIG. 7, and FIG. 9 shows a detector circuit for detecting the thermal asperities.

The arrangement of FIG. 1 comprises a magneto-resistive read head (not shown) having a magneto-resistive element 1, having a resistance value $R_{mr}$. A first transistor $T_1$ of the npn type is available having a collector terminal coupled to a first point of constant potential (+) via a resistor RI and having an emitter terminal coupled to a second point of constant potential (−), via a bias current source 4. The emitter terminal is also coupled to one terminal of the magneto-resistive element 1. A second transistor $T_2$ of the npn type is available having a collector terminal coupled to the first point of constant potential (+) via a resistor $R_1$ and an emitter terminal coupled to the other terminal of the magneto-resistive element 1, as well as to a bias current source 16. The base terminal of the transistor $T_1$ is coupled to the emitter electrode of the transistor $T_2$ via a first capacitive element 6, having a capacitance value C. The base terminal of the transistor $T_2$ is coupled to the emitter electrode of the transistor $T_1$ via a second capacitive element 8 having a capacitance value C. The terminals 10,12 form the output terminals of the arrangement.

A non-linear transconductance amplifier 14 is provided which has a first and a second input coupled to the output terminals 10 and 12, respectively, of the arrangement. The amplifier 14 has first and second outputs coupled to the base terminal of the transistor $T_1$ and $T_2$, respectively. The transconductance amplifier 14 is designed to supply control currents at its first and second outputs in response to a voltage $V_{in}$. More specifically, FIG. 2 presents two possible characteristics of the transconductance amplifier 14 for generating the control currents $i_1$ and $i_2$. FIG. 2 shows the control currents $i_1$ and $i_2$ as a function of the input voltage $V_{in}$. The non-linear characteristic is clearly visible in the figure. FIG. 2 shows a gradual increase in the slope (apart from its sign) for increasing input voltage level. Instead of this, it is also possible to have at least two regions with each a linear characteristic, where the slope of the characteristic in the region of higher input voltages is steeper than in the lower region. FIG. 2b shows a gradual increase in slope for increasing input voltage level. The bias current source 4 generates a current $I_{mr}+I_a$ and the current source 16 generates a current $I_{mr}-I_a$. $I_a$ is the quiescent current that flows through the transistors $Tr_1$ and $Tr_2$ and $I_{mr}$ is the bias current that flows through the MR element 1.

It should be noted in this respect that the embodiment of FIG. 1 is only a schematic embodiment in the sense that it only shows the elements that are essential for explaining the invention. More specifically, FIG. 1 does not show all the elements that are needed to realise the common mode setting of the read amplifier. Those elements are however well known for the skilled man.

The functioning of the arrangement is as follows. The read arrangement is based on a cross coupled architecture, as is known from U.S. Pat. No. 5,559,646. This is optimum for noise and bandwidth. The AC coupling, formed by the capacitors 6 and 8 are biased by feedback from output to input (the bases of the transistors $T_1$ and $T_2$) to output (the terminals 10,12), via the transconductance amplifier 14. In the prior art, the transconductance 14 exhibits a linear characteristic. The AC coupling time constant is therefore fixed and large.

The AC coupling time constant can be expressed as: $C*(R_{mr}+R_{in})/2*G_m*R_1$, where $R_{in}$ equals $k*T/q*I_a$. The non-linear transconductance 14 therefore provides a large time constant for small input signals, but provides a small time constant for larger signals. In fact, the resultant behaviour is that the low frequency cut-off of the amplifier is shifted to higher frequencies for higher input signal levels.

The embodiment of FIG. 1 shows a single stripe magneto-resistive element. FIG. 3 shows a read arrangement for a dual stripe magneto-resistive head, with a further elaboration of the non-linear transconductance amplifier, denoted wit the reference numeral 14' in figure 3. The two magneto-resistive elements of the dual stripe magneto-resistive read head, denoted $R_{mr1}$ and $R_{mr2}$, are now coupled between the emitters of the transistors $T_1$ and $T_2$, respectively, and the second point of constant potential (−). The transconductance amplifier 14' is in the form of a class AB stage in order to have low noise. Further, the current source 4 in FIG. 1 is positioned at another location in the circuit of FIG. 3, bears the reference numeral 4' and generates a current $I_{mr}-I_a$.

The non-linear transconductance amplifier 14' comprises transistors $Tr_3$ and $Tr_7$ of the npn type, having their bases coupled to the output terminal 10, transistors $Tr_4$ and $Tr_8$ of the npn type, having their bases coupled to the output terminal 12. The transistor $Tr_7$ has its collector coupled to the first point of constant potential (+) and its emitter coupled to the second point of constant potential (−), via a series connection of a diode $D_1$ and a current source 30. The terminal interconnecting the diode $D_1$ and the current source 30 is coupled to the base of a transistor $Tr_5$, of the pnp type, which has its emitter coupled to the emitter of the transistor $Tr_3$. The collector of the transistor $Tr_3$ is coupled to a first output 40 of a non-linear current mirror circuit 32. The collector of the transistor $Tr_5$ is coupled to a first output 42 of a non-linear current mirror circuit 36. A second output 44 of the current mirror circuit 32 is coupled to the base of the transistor $Tr_1$ as well as to a second output 46 of the current mirror circuit 36.

The transistor $Tr_8$ has its collector coupled to the first point of constant potential (+) and its emitter coupled to the second point of constant potential (−), via a series connection of a diode $D_2$ and a current source 50. The terminal interconnecting the diode $D_2$ and the current source 50 is coupled to the base of a transistor $Tr_6$, of the pnp type, which has its emitter coupled to the emitter of the transistor $Tr_4$. The collector of the transistor $Tr_4$ is coupled to a first output 52 of a non-linear current mirror circuit 34. The collector of the transistor $Tr_6$ is coupled to a first output 56 of a non-linear current mirror circuit 38. A second output 54 of the current mirror circuit 34 is coupled to the base of the transistor $Tr_2$ as well as to a second output 58 of the current mirror circuit 38. The interconnected emitters of the transistors $Tr_3$ and $Tr_5$ are coupled to the interconnected emitters of the transistors $Tr_4$ and $Tr_6$, via an impedance 60. The impedance 60 includes a first path comprising two series connected resistors $R_e$ and a second path comprising two series connected capacitors $C_e$. The circuit part comprising the impedance 60 and the transistors $Tr_3$ to $Tr_8$, (and more specifically also the diodes $D_1$, $D_2$ and the current sources 30 and 50) form a voltage-to-current converter circuit, to be described later.

The current sources 62 and 64 provide a current $I^c$, which is the quiescent current for the bases of the transistors $Tr_1$ and $Tr_2$.

Upon occurrence of an asperity, a DC voltage of substantial amplitude appears across the output terminals 10 and 12. Suppose that the voltage on terminal 10 is higher than on the terminal 12. Or, the current through the transistor $Tr_2$ is larger than the current through the transistor $Tr_1$. The higher voltage on terminal 10 results in a current, from left to right in FIG. 3, through the impedance 60. This current flows from the output 40 of the current mirror 32, through the impedance 60 to the terminal 56 of the current mirror circuit 38. This current is copied in the non-linear current mirror 32 and results in a current from the output 44 towards the base of the transistor $Tr_1$ and the capacitor 6. This current is also copied in the non-linear current mirror 38 and results in a current from the capacitor 80 and the base of the transistor $Tr_2$ towards the terminal 58 of the current mirror 38. As a result, the capacitor 6 is charged, resulting in a larger base voltage for the transistor $Tr_1$, and thus a larger current through the transistor $Tr_1$. Further, the capacitor 8 is discharged, resulting in a decrease in the base voltage of transistor $Tr_2$, and thus a smaller current through the transistor $Tr_2$. This results in a suppression of the asperity, as the low frequency cut-off frequency of the read amplifier is increased for higher amplitudes.

Suppose that, as a result of the thermal asperity, the voltage on the terminal 12 is higher than on the terminal 10. Or, the current through the transistor $Tr_1$ is larger than the current through the transistor $Tr_2$. The higher voltage on the terminal 12 than on terminal 10 results in a current running from right to left in FIG. 3 through the impedance 60. This current flows from the output 52 of the current mirror 34, through the impedance 60 to the terminal 42 of the current mirror circuit 36. This current is copied in current mirror 34 and results in a control current from the output 54 towards the base of the transistor $Tr_2$ and the capacitor 8. This current is also copied in the current mirror 36 and results in a control current from the base of the transistor $Tr_1$ and the capacitor 6 to the terminal 46 of the current mirror 36. As a result, the capacitor 8 is charged, resulting in a larger base voltage for the transistor $Tr_2$, and thus a larger current through the transistor $Tr_2$. Further, the capacitor 6 is discharged, resulting in a decrease in the base voltage of the transistor $Tr_1$ and thus a smaller current through the transistor $Tr_1$. This results again in a suppression of the asperity, as the low frequency cut-off frequency of the read amplifier is increased for higher amplitudes.

The non-linear behaviour in the non-linear current mirrors of FIG. 3 is realised in the following way. Reference is made to FIG. 6, which shows the essential element of the current mirrors 32 and 34. Because of the symmetric construction, the currents $I_x$ through the transistors $Tr_{10}$ and $Tr_{11}$ are equal to each other. Further, assuming the currents at the terminals 40 and 52 equal 140 and 152, respectively, the currents $I_{10}$ and $I_{11}$ both equal $(I_{40}-I_{52})/2$ and thus equals the current $I^r$ through the resistors $R_{nl}$: $I_r=(I_{40}-I_{52})/2$.

The circuit point 70 can be considered to have a constant potential, e.g. $V_d$. Thus, the voltage at the base of the transistor $Tr_{12}$ equals $V_d+V$, where $V=(I_{40}-I_{52})*R_{nl}/2$. In the same way, the voltage at the base of the transistor $Tr_{13}$ equals $V_d-V$. As a result of the voltage present at the base of transistor $Tr_{12}$, the current $I_{44}$ through this transistor $Tr_{12}$ equals:

$$I_{44}=I_0 \exp(V_d+V)$$

and the current 154 through the transistor $Tr_{13}$ equals:

$$I_{54}=I_0 \exp(V_{d-V}).$$

Thus, for large voltage values V, $I_{44}$ becomes larger and $I_{54}$ gets smaller. The exponential term in the above formulae accounts for the non-linear behaviour of the current mirrors. For thermal asperities, V is very large, resulting in a current $I_{54}$ that will be very small and can be neglected, as has been done in the above explanation of the behaviour of the non-linear transconductance amplifier of FIG. 3.

FIG. 4 shows an input signal applied to the amplifier in accordance with the invention. The asperity accounts for the sharp increase in the input signal. FIG. 5 shows two output signals. One denoted 'linear', is obtained with a read amplifier exhibiting a linear control characteristic and the output signal denoted "non-linear" is obtained with the read amplifier in accordance with the invention. Clearly visible is that the wanted signal, which is the sinusoid superimposed on the asperity signal, is amplified by a factor of roughly 15, and remains visible through the asperity, whilst moreover the amplification factor for the asperity signal is largely reduced, to roughly 5.

It can further be said that the read amplifier can be followed in a later stage by a further correction circuit equivalent to the asperity correction circuit explained above. This further correction circuit can function on signals having a higher amplitude, so that in this further correction circuit a further asperity reduction can be obtained.

FIG. 7 shows a further embodiment of the reading arrangement. The magneto-resistive head $R_{mr}$ is coupled to a block 70 which denotes the non-linear transconductance amplifier as described above with reference to FIG. 1 or 3. The output of the block 70 is coupled to an input of a block 72 which realises an AC coupling and can be in the form of an HP filter circuit, such as a capacitor. The output of the block 72 is coupled to an input of a block 74 which comprises a voltage controlled amplifier, which has an output coupled to a block 76, which is in the form of an equalizer filter. The output of the equalizer filter 76 is coupled to a block 78 which carries out a DC correction on its input signal. An output of the block 78 is coupled to inputs of a bit detection block 80 and a subtractor unit 82, to the latter via a delay unit 83. An output of the bit detection block 80 is coupled to an output terminal 88 as well as, via a filter unit 85, to a second input of the subtractor unit 82. An output of the subtractor unit 82 is coupled via a connection denoted by A to a control input of the correction unit 78.

The function of the non-linear transconductance amplifier 70 was to suppress the thermal asperities as far as possible. Suppose, as an example, that the amplitude ratio R, defined as the ratio of the amplitude of the thermal asperity $V_{TA}$ and the peak-peak amplitude $V_{pp}$ of the information signal, in the output signal of the read head $R_{mr}$ is at maximum 20, then the amplifier 70 might, in unfavourable conditions, result in a ratio in its output signal of around 10. Under the influence of the AC coupling in the block 72 and the signal processing in the blocks 74 and 76, the ratio R is further decreased, for example to a value of 3. Now, in this situation, it is possible to further suppress the influence of the thermal asperities by carrying out a DC correction.

For partial response detection systems, as well as for dual feedback equalizer (DFE) detection systems, the input signal to the bit detection unit 80 is not free of inter-symbol-interference (ISI). In order to realise a correct error signal in the subtractor 82, it is required to filter the detected data signal at the output of the bit detector unit 80, in the filter unit 85. The filter unit 85 has such a filter response H(f), that it replicates the ISI-structure at the input of the bit detector unit 80. The impulse response function of the filter H(f) equals in principle the 'target' response of the detector 80 (although other choices for the impulse response are also possible and useful, especially when the DC correction loop is asynchronous). Further, delays occurring in the bit detector unit 80 and the filter unit 85 can be corrected for by the delay unit 83. For a bit detector unit 80 in the form of a slicer, the circuit simplifies for the reason that the blocks 83 and 85 can be dispensed with.

FIG. 8 shows the complete circuit that realises the DC correction in more detail. An error signal is generated which is the difference between the input signal to the bit detector unit 80 and the output signal of the bit detector unit 80, that is: the actual data signal. The bit detector unit 80 can be asynchronous, or can include a sampler. The error signal obtained by the subtractor unit 82 is fed via the line denoted A to an integrating circuit 84 included in the DC correction unit 78. The output signal of the integrating circuit 84 is a measure of the DC value in the input signal of the subtractor unit 86, which is again a measure of the remaining influence of the asperities at this stage in the read out circuit. The functioning of the DC correction is thus such that the error signal on the line denoted A is controlled towards zero.

The DC correction is based on the error signal. The data, however, is already removed from the error signal in the block 82. Thus, in principle, only the DC offset is fed back, not the data. Therefore, the DC correction does not distort the data. This is contrary to prior art ways of solving this problem. A prior art way is a non-linear control of the AC coupling in the block 72. This however also influences the data, which is not desired.

By making the DC correction fast (by increasing the loop gain), the data can be read, even though aggressive asperities, without making lots of errors. With the further use of ECC techniques, it is possible to read through most asperities, without uncorrectable errors.

The DC correction control loop can be non-linear, in the sense that for small amplitude asperities, the time constant of the loop is relatively large and that for large amplitude asperities, the time constant is smaller. Making the time constant in the loop smaller can be realised by increasing the loop gain. This can be done in an automatic fashion by inserting a suitable non-linearity block 87 between blocks 82 and 84. The non-linearity should be odd, and should basically provide a gain that increases with input signal amplitude.

For sufficiently large signal amplitudes the gain may level off again so as to restrict dynamic range of the resulting output signal and simplify implementation.

The non-linearity provides extra loop gain and hence faster response to large deviations from the wanted situation.

By introducing some hysteresis, the increased loop gain can be maintained for a somewhat longer time so as to reduce the duration of the tail of the loop-settling response.

FIG. 9 shows an additional circuit arrangement for use in the read out circuit of the invention, for detecting residual asperities, i.e. for detecting any asperities that remain in front of the bit detector after application of the aforementioned suppression and compensation techniques. The circuit arrangement of FIG. 9 comprises a lowpass filter unit 90, which has an output coupled to inputs of comparator circuits 92 and 94. Outputs of the comparator circuits are coupled to corresponding inputs of a combiner circuit 96, which has an output coupled to a one-shot circuit 98.

A thermal asperity detector is needed in order to improve the reliability of the read arrangement. It can warn the read arrangement that there can be a problem with the corresponding part of the data signal. Precautionary actions can be taken, so that the overall performance of the read out arrangement can be improved. A prior art way of detecting asperities is to detect the peak values of the read out signal and check whether they remain within certain limits. This procedure is data (PW50) dependent and is affected by DC-offset. In principle, a thermal asperity detector should follow the baseline of the signal and it should detect anomalies.Thermal asperity detection in the pre-amplifier and in the channel IC is not the same. In the pre-amplifier, thermal asperities are detected, independent of whether they are corrected in the read channel path, that could have been incorporated in a channel IC. This path can identified by the blocks 72 to 82 in FIG. 7, although it should be stressed that the read channel path may comprise other circuits, such as control loops that will be discussed later.

In the present invention, however, thermal asperity detection is carried out in the channel IC, by detecting any asperities that remain in front of the bit detector after application of the aforementioned suppression and compensation techniques. These residual asperity effects manifest themselves in the form of a short-term DC-offset in the error signal present at the output of subtraction circuit 82 in FIGS. 7 and 8. To detect this offset in the presence of additional disturbances that are contained in the error signal, such as residual intersymbol interference and noise, the error is first applied to a low-pass filter. It is then compared to positive and negative threshold values +Vth and −Vth, respectively.

When the signal applied to the comparators 92 and 94 exceeds the threshold value, a residual thermal asperity-effect is detected. The output signals of the comparator units 92 and 94 are combined in the combiner 96 and a one shot 98 may be provided to lengthen the detection pulse that indicates the occurrence of a residual asperity-effect. The output signal of the one shot 98 can be used, for example, as an 'erasure' indicator for the error correction circuitry outside the channel IC, or as a control signal for circuits within channel IC.

This control signal can be used, for example, to command the read PLL within the channel IC to coast, or the AGC within the channel IC to freeze.

Whilst the invention has been described with reference to preferred embodiments thereof, it is to be understood that these are not limitative examples. Thus, various modifications may become apparent to those skilled in the art, without departing from the scope of the invention, as defined by the claims. As an example, the measure of the DC correction carried out and the measure to generate an asperity detection signal, as explained with reference to the FIGS. 7, 8 and 9, can be applied separately from the measure to use the non-linear read amplifier described with reference to the FIGS. 1 to 6.

Further, the invention lies in each and every novel feature and combination of features.

What is claimed is:

1. An arrangement for reading information from a record carrier, the arrangement comprising:
   a read head having at least one magneto-resistive element;
   a first transistor having a control terminal and first and second main terminals; and
   a second transistor having a control terminal and first and second main terminals, the control terminal of the first transistor being coupled to the first main terminal of the second transistor via a first capacitive element, the control terminal of the second transistor being coupled to the first main terminal of the first transistor via a second capacitive element, the first main terminal of the first transistor being coupled to a terminal of said magneto-resistive element, the first main terminal of the second transistor being coupled to a terminal of a second magneto-resistive element, the second main terminals of the first and the second transistors being coupled to a first point of constant potential via first and second impedance means, respectively, characterized in that said arrangement further comprises:
   non-linear transconductance means having first and second inputs coupled to the second main terminals of the first and second transistors, respectively, and first and second outputs coupled to the control terminals of the first and second transistors, respectively, the non-linear transconductance means being adapted to supply a control current at the first output in response to a voltage present across said first and second inputs, such that for first and second input voltages across said first and second inputs, resulting in first and second control currents, respectively, at said first output, the first input voltage being larger than the second input voltage, the amplification factor of the transconductance means is larger for generating the first control current than for generating the second control current.

2. The arrangement as claimed in claim 1, characterized in that the non-linear transconductance means is further adapted to supply a control current at the second output in response to a voltage present across said first and second inputs, such that for first and second input voltages across said first and second inputs, resulting in third and fourth control currents, respectively, at said second output, the first input voltage being larger than the second input voltage, the amplification factor of the transconductance means is larger for generating the third control current than for generating the fourth control current.

3. The arrangement as claimed in claim 1, characterized in that the non-linear transconductance means comprises:

voltage-to-current conversion means for generating a current in response to a voltage appearing across the first and second inputs of the non-linear transconductance means;

first non-linear current mirror means for generating a first output current in response to the current generated by the voltage-to-current conversion means, said first non-linear current mirror means supplying said first output current as the control current to the first output of the non-linear transconductance means;

second non-linear current mirror means for generating a second output current in response to the current generated by the voltage-to-current conversion means, said second non-linear current mirror means supplying said second output current as the control current to the second output of the non-linear transconductance means.

4. The arrangement as claimed in claim 3, characterized in that the voltage-to-current conversion means comprises:

third transistor means having a control electrode coupled to the first input of the transconductance means, and having a first and a second main electrode;

fourth transistor means having a control electrode coupled to the second input of the transconductance means, and having a first and a second main electrode;

second impedance means coupled between the first main electrodes of the third and fourth transistor means;

fifth transistor means having a control electrode coupled to the first input of the transconductance means, and having a first and a second main electrode; and sixth transistor means having a control electrode coupled to the second input of the transconductance means, and having a first and a second main electrode, the first main electrodes of the fifth and sixth transistor means being coupled to the first main electrodes of the third and fourth transistor means, respectively, the second main electrodes of the third and the third and fifth transistor means being coupled to the first non-linear current mirror means, and the second main electrodes of the fourth and sixth transistor means being coupled to the second non-linear current mirror means.

5. The arrangement as claimed in claim 4, characterized in that the first non-linear current mirror means comprises:

a first non-linear current mirror having a terminal coupled to the first point of constant potential, and having first and second current terminals, the first current terminal being coupled to the second main electrode of the third transistor means and the second current terminal being coupled to the control terminal of the first transistor; and a second non-linear current mirror having a terminal coupled to a second point of constant potential, and having first and second current terminals, the first current terminal being coupled to the second main electrode of the fifth transistor means, and the second current terminal being coupled to the control terminal of the first transistor and the second current terminal of the first non-linear current mirror, and the second non-linear current mirror means comprises:

a third non-linear current mirror having a terminal coupled to the first point of constant potential, and having first and second current terminals, the first current terminal being coupled to the second main electrode of the fourth transistor means, and the second current terminal being coupled to the control terminal of the second transistor; and a fourth non-linear current mirror having a terminal coupled to the second point of constant potential, and having first and second current terminals, the first current terminal being coupled to the second main electrode of the sixth transistor means, and the second current terminal being coupled to the control terminal of the second transistor and the second current terminal of the third non-linear current mirror.

6. The arrangement as claimed in claim 1, characterized in that the read head comprises a single stripe magneto-resistive head having one magneto-resistive element, and that the second magneto-resistive element is the same element as the at least one magneto-resistive element.

7. The arrangement as claimed in claim 1, characterized in that the read head comprises a dual stripe magneto-resistive head having a first and a second magneto-resistive element, a second terminal of the first magneto-resistive element being coupled to a second point of constant potential and a second terminal of the second magneto-resistive element being coupled to said second point of constant potential.

8. The arrangement as claimed in claim 1, characterized in that said arrangement further comprises:

DC correction means for subtracting a correction value from an input signal in response to an error signal to form a DC corrected output signal;

bit detection means for detecting a sequence of bits based on the DC corrected output signal; and error signal generating means for generating the error signal in response to the DC corrected output signal and the sequence of bits.

9. The arrangement as claimed in claim 8, wherein the error signal generating means comprises subtraction means for subtracting the sequence of bits from the DC corrected output signal or a filtered version thereof, and wherein the DC correction means comprises integrating means for integrating the error signal to form a correction signal, and subtraction means for subtracting the correction signal from the input signal.

10. The arrangement as claimed in claim 8, wherein the arrangement further comprises non-linear amplifying means for non-linearly amplifying the error signal prior to applying the error signal to the DC correction means.

11. The arrangement as claimed in claim 8, characterized in that said arrangement further comprises:

comparator means for comparing a low-pass filtered version of the error signal with a threshold value; and means for generating an asperity detection signal in response to the filtered version of the error signal exceeding the threshold value.

12. A hard disk drive, provided with the arrangement as claimed in claim 1.

* * * * *

Disclaimer

6,304,396 B1 — Joao N. V. L. Ramalho, Bieville-Beuville (FR); Johannes O. Voorman, Eindhoven (NL); Patrick Leclerc, Caen (FR); Jozef A. M. Ramaekers, Eindhoven (NL); Marcel L. Lugthart, Eindhoven (NL); Johannes W. M. Bergmans, Eindhoven (NL). ARRANGEMENT FOR READING INFORMATION FROM A MAGNETIC RECORD CARRIER. Patent dated October 16, 2001. Disclaimer filed March 28, 2008, by the assignee, U.S. Philips Corporation.

Hereby enters this disclaimer to all claims of said patent.

*(Official Gazette, April 7, 2009)*